United States Patent [19]

Kikuchi

[11] Patent Number: 5,298,449
[45] Date of Patent: Mar. 29, 1994

[54] SEMICONDUCTOR SUBSTRATE HAVING A SILICON-ON-INSULATOR STRUCTURE AND METHOD OF FABRICATION THE SAME

[75] Inventor: Hiroaki Kikuchi, Tokyo, Japan
[73] Assignee: NEC Corporation, Tokyo, Japan
[21] Appl. No.: 28,932
[22] Filed: Mar. 8, 1993

[30] Foreign Application Priority Data

Mar. 6, 1992 [JP] Japan ................... 4-49933

[51] Int. Cl.$^5$ .......................... H01L 21/76
[52] U.S. Cl. ........................ 437/63; 437/62; 437/974; 148/DIG. 12; 148/DIG. 135
[58] Field of Search ............ 437/63, 62, 974; 198/DIG. 12, DIG. 135

[56] References Cited

U.S. PATENT DOCUMENTS

| | | | |
|---|---|---|---|
| 4,566,914 | 1/1986 | Hall | 437/62 |
| 4,808,546 | 2/1989 | Moniwa et al. | 437/62 |
| 4,874,718 | 10/1989 | Inoue | 437/62 |
| 4,963,505 | 10/1990 | Fujii et al. | 148/DIG. 12 |
| 5,091,330 | 2/1992 | Cambou et al. | 437/974 |
| 5,238,865 | 8/1993 | Eguchi | 437/974 |

FOREIGN PATENT DOCUMENTS 2-168646  6/1990  Japan.
3-105944  5/1991  Japan.
3-142952  6/1991  Japan.

OTHER PUBLICATIONS

"Silicon Wafer-Bonding Process Technology for Soi Structures", By T. Abe et al., pp. 61-71.

Primary Examiner—Brian E. Hearn
Assistant Examiner—Trung Dang
Attorney, Agent, or Firm—Young & Thompson

[57] ABSTRACT

The invention provides a silicon-on-insulator semiconductor substrate structure and a method of fabricating the same. The structure includes a base silicon substrate, a mono-crystalline silicon film formed on the base silicon substrate in a predetermined region, a poly-crystalline silicon film formed on the base silicon substrate in opposite region to the predetermined region, an insulator film formed on the polycrystalline silicon film, and a mono-crystalline silicon layer overlaying both the insulator film and the mono-crystalline silicon film so that the mono-crystalline silicon layer is electrically connected to the base silicon substrate through the mono-crystalline silicon film. The mono-crystalline silicon film permits not the mono-crystalline silicon layer only but also the base silicon substrate to serve as active regions.

12 Claims, 13 Drawing Sheets

5,298,449

SEMICONDUCTOR SUBSTRATE HAVING A SILICON-ON-INSULATOR STRUCTURE AND METHOD OF FABRICATION THE SAME

BACKGROUND OF THE INVENTION

The invention relates to a semiconductor substrate structure, and more particularly to a semiconductor substrate having a silicon-on-insutator structure and a method of fabricating the same.

With respect to semiconductor devices made of silicon, the silicon-on-insulator (SOI) structure is important for improvements in a high speed performance, a high reliability and a high withstand voltage. The silicon-on-insulator (SOI) structure which has been formed thereon with a semiconductor integrated circuit device permits the circuit device to exhibit the high speed performance, the high reliability and the high withstand voltage.

In recent years, a wafer bonding method has been employed to form the silicon-on-insulator (SOI) structure. In this wafer bonding method, a bonded wafer which has been formed with an insulator film at its one or opposite surfaces is bonded with a base wafer by using a heat treatment such as annealing. Generally, the wafer bonding method permits a low density of crystal defects which are generated in the bonded mono-crystalline silicon wafer formed on the insulator film. Further, the wafer bonding method permits a low cost manufacture of the silicon-on-insulator (SOI) structure. One of the wafer bonding methods is disclosed in "Proceeding of the 4th International Symposium on Silicon-on-Insulator Technology and Device", 1990, pp. 61–71.

A conventional wafer bonding method will be described with reference to FIGS. 1A to 1C.

As shown in FIG. 1A, a first silicon substrate 16 which has been doped with a p-type dopant such as boron is prepared. The doped first silicon substrate 16 has a specific resistance of 10 ohm·cm. An entire surface of the first silicon substrate 16 is so oxidized that a dioxide silicon film 17 having a thickness of approximately 5000 angstroms is formed on the entire surface of the first silicon substrate 16.

As shown in FIG. 1B, a second silicon substrate 18 which has been doped with the p-type dopant such as boron is also prepared. The second silicon substrate 18 has a specific resistance of approximately 15 ohm·cm. The first and second silicon substrates 16 and 18 are contacted through the insulator film 17, after which a heat treatment of the device is accomplished in a nitrogen atmosphere for an hour at a temperature of 1100° C. This results in that the first and second silicon substrates 16 and 18 are bonded through the insulator film 17.

As shown in FIG. 1C, an opposite surface to the dioxide silicon film 17 formed on the first silicon substrate 16 is subjected to a mirror polishing so that the first silicon substrate 16 is made into a mono-crystalline silicon layer 19 having a thickness of 5 micrometers.

Other conventional wafer bonding method will subsequently be described with reference to FIGS. 2A to 2C.

As shown in FIG. 2A, a first silicon substrate 16 which has been doped with an n-type dopant such as arsenic or phosphorus is prepared. The doped first silicon substrate 16 has a specific resistance of 15 ohm·cm. An entire surface of the first silicon substrate 16 is so oxidized that a dioxide silicon film 17 having a thickness of approximately 2000 angstroms is formed on the entire surface of the first silicon substrate 16.

As shown in FIG. 2B, a second silicon substrate 18 which has been doped with the n-type dopant such as boron is also prepared. The second silicon substrate 18 has a specific resistance of approximately 20 ohm·cm. The first and second silicon substrates 16 and 18 are connected through the insulator film 17, after which a heat treatment of the device is accomplished in a nitrogen atmosphere for an hour at a temperature of 1100° C. This results in that the first and second silicon substrates 16 and 18 are connected through the insulator film 17.

As shown in FIG. 2C, an opposite surface to the dioxide silicon film 17 formed on the first silicon substrate 16 is subjected to a mirror polishing so that the first silicon substrate 16 is made into a monocrystalline silicon layer 19 having a thickness of 3 micrometers.

In the conventional silicon-on-insulator structure fabricated by the above described wafer bonding methods, the monocrystalline silicon layer 19 is electrically separated from the second silicon substrate 19 serving as a base wafer through a dioxide silicon film 17 serving as an insulator film. Thus, a semiconductor integrated circuit is generally formed only on the monocrystalline silicon layer 19. The second silicon substrate 18 serving as a base wafer is not available as an active region to be formed thereon with any integrated circuit device. The first silicon layer 19 only is available as an active region to be formed thereon with an integrated circuit device. It is desirable that the silicon-on-insulator structure has double silicon substrates sandwiching an insulator film, both of which are available as active regions to be formed thereon with semiconductor integrated circuit devices. A development of such silicon-on-insulator structure having the active double silicon substrates permits a novel and attractive semiconductor integrated circuit device to be realized.

In addition, in the fabrication processes, the conventional silicon-on-insultor structure do not allow a gettering process to be applied to the fabrication processes, although it is applicable to fabrication processes for other semiconductor devices such as bulk semiconductor devices. The gettering process is important to allow the semiconductor device to exhibit excellent performances. The gettering is able to remove undesirable heavy metal impurities from an interior of the semiconductor device to a region outside the active region. The gettering process is generally accomplished by a high temperature heat treatment thereby removing the heavy metal impurity. The semiconductor device fabricated through the gettering process is able to exhibit an excellent property, because the active region of the device has no heavy metal impurity. It is, thus, desired to develop a novel silicon-on-insulator structure which makes a gettering process applicable so as to realize an excellent device performance.

SUMMARY OF THE INVENTION

Accordingly, it is a primary object of the present invention to provide a semiconductor substrate having an improved silicon-on-insulator structure.

It is a further object of the present invention to provide a semiconductor substrate having an improved silicon-on-insulator structure which permits both silicon substrate sandwiching an insulator film to be serve as active regions.

It is a still further object of the present invention to provide a semiconductor substrate having an improved silicon-on-insulator structure involving active regions having no heavy metal impurity.

It is another object of the present invention to provide a novel fabrication method of a semiconductor substrate having an improved silicon-on-insulator structure.

It is still another object of the present invention to provide a novel fabrication method of a semiconductor substrate having an improved silicon-on-insulator structure which permits both silicon substrate sandwiching an insulator film to be serve as active regions.

It is yet another object of the present invention to provide a novel fabrication method of a semiconductor substrate having an improved silicon-on-insulator structure involving active regions having no heavy metal impurity.

The above and other objects, features and advantages of the present invention will be apparent from the following descriptions.

The present invention intends to provide a novel semiconductor substrate having a silicon-on-insulator structure. The novel substrate comprises a base silicon substrate, a mono-crystalline silicon film formed on the base silicon substrate in a predetermined region, an insulator film formed on the base silicon substrate in opposite region to the predetermined region, and a mono-crystalline silicon layer overlaying both the insulator film and the mono-crystalline silicon film so that the mono-crystalline silicon layer is electrically connected to the base silicon substrate through the mono-crystalline silicon film.

The present invention also intends to provide other novel semiconductor substrate having a silicon-on-insulator structure. The other novel substrate comprises a base silicon substrate, a mono-crystalline silicon film formed on the base silicon substrate in a predetermined region, a polycrystalline silicon film formed on the base silicon substrate in opposite region to the predetermined region, an insulator film formed on the polycrystalline silicon film, and a mono-crystalline silicon layer overlaying both the insulator film and the mono-crystalline silicon film so that the mono-crystalline silicon layer is electrically connected to the base silicon substrate through the mono-crystalline silicon film.

The present invention further provides a method of fabricating a novel semiconductor substrate having a silicon-on-insulator structure. The fabrication method comprises the following steps. An insulation film is selectively formed on one surface of a first silicon substrate so as to expose the one surface in a predetermined region of the first silicon substrate. An amorphous silicon film is so formed as to cover both the insulation film and the exposed surface of the first silicon substrate. The first silicon substrate is contacted with a second silicon substrate. The first and second silicon substrates are subjected to a heat treatment so that the amorphous silicon film becomes both a mono-crystalline silicon film in contact with the exposed surface of the first silicon substrate and a polycrystalline silicon film in contact with the insulation film. This results in that the first and second silicon substrates are electrically connected though the mono-crystalline silicon film.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

A first embodiment of the present invention which provides a semiconductor substrate having an improved silicon-on-insulator structure will be described in detail with reference to FIGS. 3A to 3D.

Figure 1A:
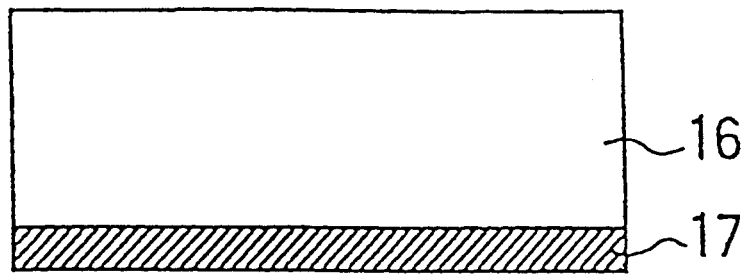
FIGS. 1A to 1C are fragmentary cross sectional elevation views illustrative of sequential steps involved in the conventional fabrication method of the semiconductor substrate having the conventional silicon-insulator structure.
Figure 1B:
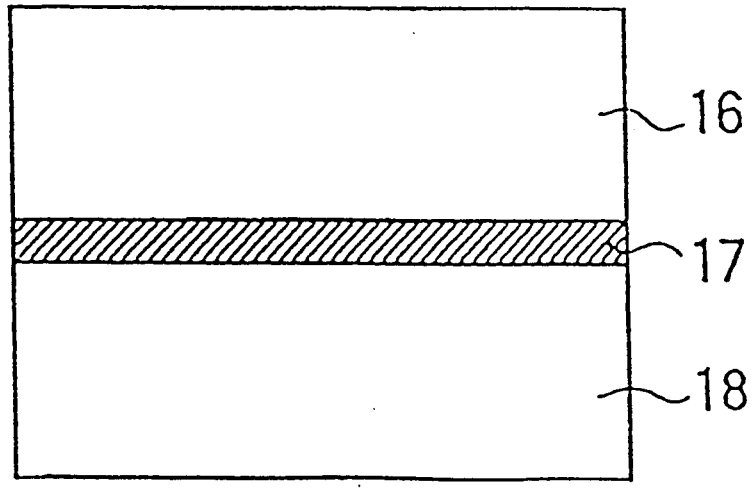
Figure 1C:
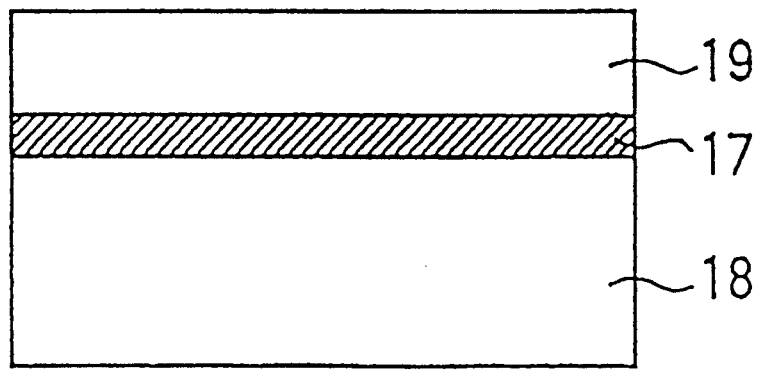
Figure 2A:
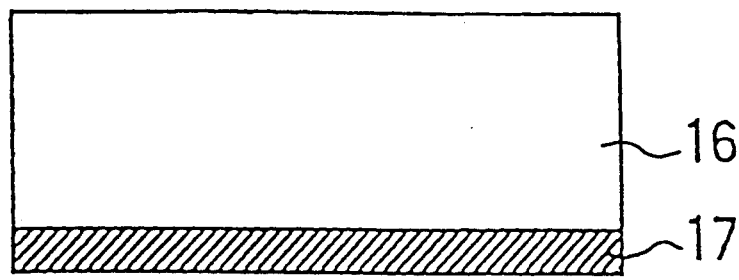
FIGS. 2A to 2C are fragmentary cross sectional elevation views illustrative of sequential steps involved in the other conventional fabrication method of the semiconductor substrate having the other conventional silicon-on-insulator structure.
Figure 2B:
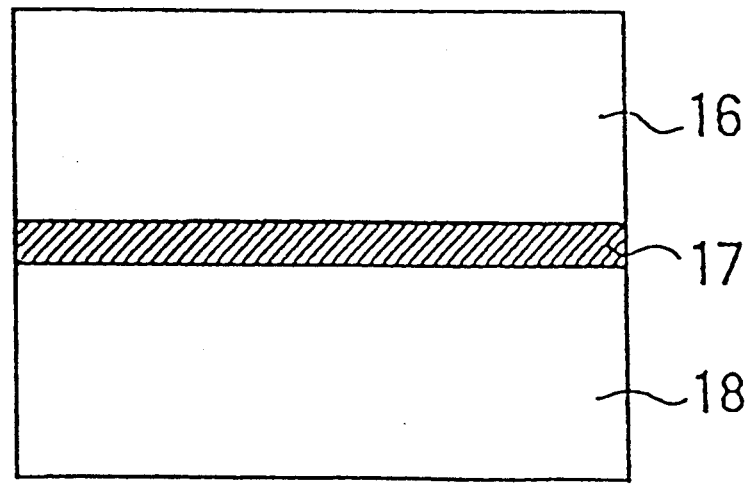
Figure 2C:
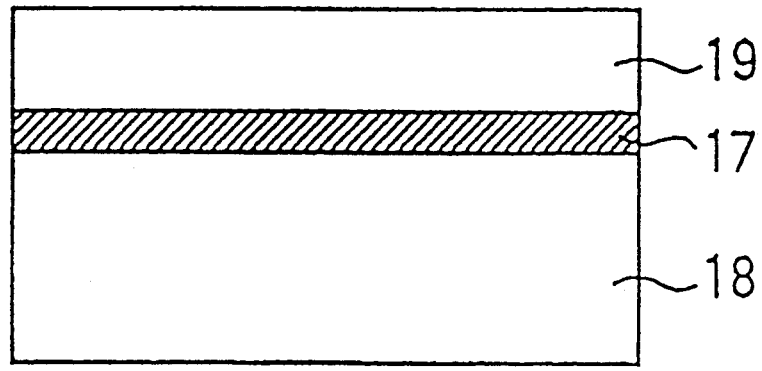
Figure 3A:
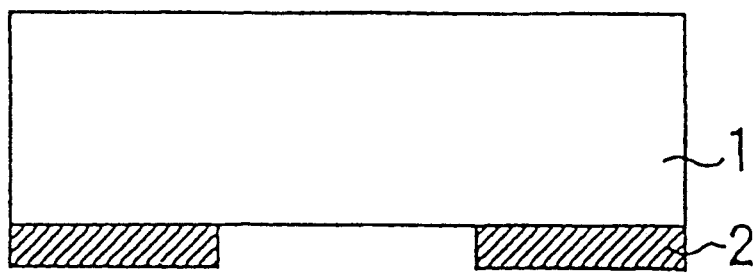
FIGS. 3A to 3D are fragmentary cross sectional elevation views illustrative of sequential steps involved in a novel fabrication method of a semiconductor substrate having an improved silicon-on-insulator structure of a first embodiment according to the present invention.

With reference to FIG. 3A, a first silicon substrate 1 which has been doped with a p-type dopant or boron is prepared. The first silicon substrate 1 has a specific resistance of 10 ohm·cm. An entire surface of the first silicon substrate 1 is subjected to a thermal oxidation so that a dioxide silicon film 2 having a thickness of approximately 5000 angstroms is formed on the entire surface of the first silicon substrate 1. Further, the dioxide silicon film 2 but only in a predetermined region is removed by a dry etching process and a wet etching process. A surface of the first silicon substrate 1 but in the predetermined region is exposed. Then, the dioxide silicon film 2 remains only in an opposite region to the predetermined region. As a result, a surface region but in the predetermined region of the first silicon substrate 1 is exposed. A surface region except for the predetermined region of the first silicon substrate 1 is covered with the remaining dioxide silicon film 2 which serves as an insulator film.

Figure 3B:
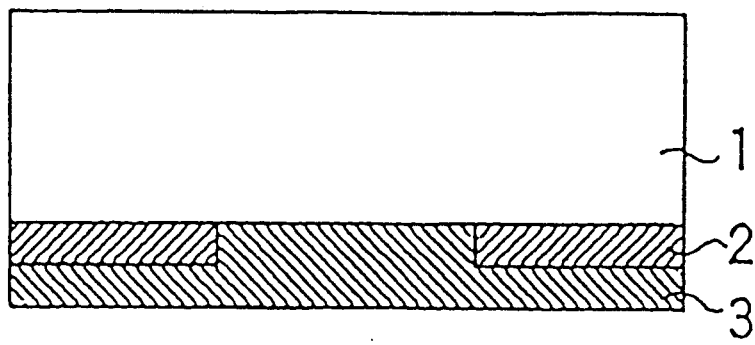

With reference to FIG. 3B, a chemical vapor deposition of amorphous silicon is accomplished. As a result, an amorphous silicon film 3 having a thickness of approximately 2 micrometers is formed on an entire surface of the device so as to cover both the remaining dioxide silicon film 2 and the exposed surface of the first silicon substrate 1. Further, a surface of the amorphous silicon film 3 is subjected to a mirror polishing so as to have no stress and an excellent flatness.

Figure 3C:
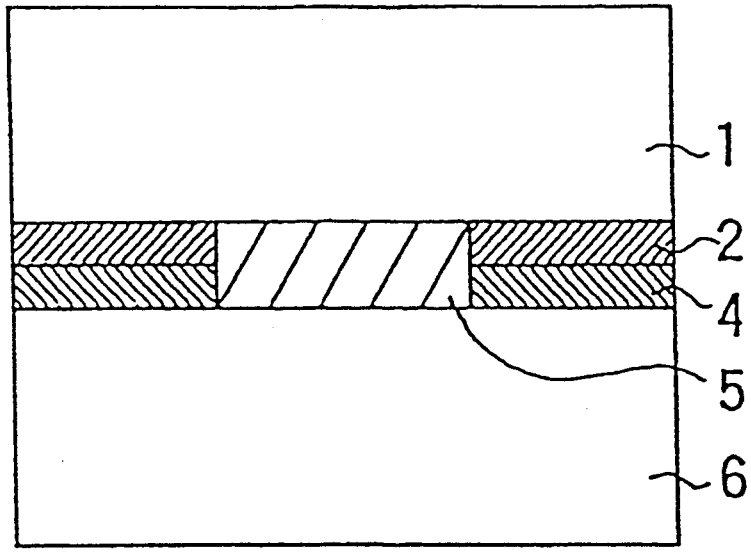

With reference to FIG. 3C, a second silicon substrate 6 which has been doped with the p-type dopant or boron is prepared. The second silicon substrate 6 has a specific resistance of 15 ohm·cm. The second silicon substrate 6 is contacted with the first silicon substrate 1 through the mirror polished amorphous silicon film 3. After that, the first and second silicon substrates 1 and 6 contacted through the mirror polished amorphous silicon film 3 is subjected to a heat treatment at a temperature of 1100° C. in a nitrogen atmosphere for an hour. As a result, the first and second silicon substrates 1 and 6 are bonded through the mirror polished amorphous silicon film 3. Concurrently, the mirror polished amorphous silicon film 3 but only at its part in contact with the dioxide silicon film 2 is made into a polycrystalline silicon film 4. In contrast, the mirror polished amorphous silicon film 3 but at its opposite part in contact with the exposed surface of the first silicon substrate 1 is made into a mono-crystalline silicon film 5.

Figure 3D:
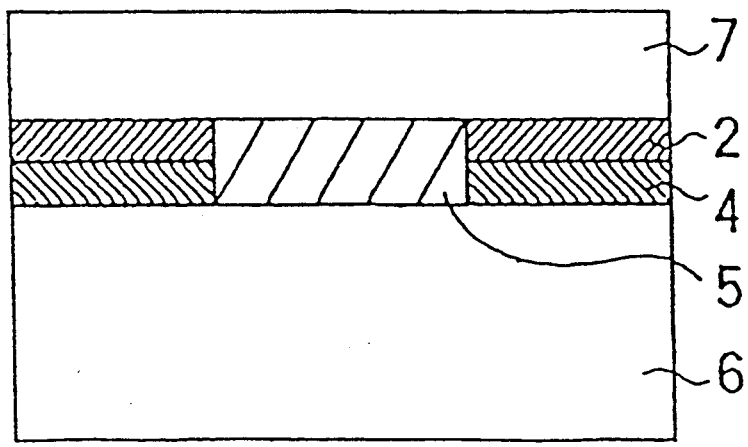

With reference to FIG. 3D, an opposite surface of the first silicon substrate 1 to the dioxide silicon film 2 is subjected to a mirror polishing thereby the dioxide silicon film is made into a mono-crystalline silicon layer 7 having a thickness of approximately 5 micrometers.

The structure of a novel semiconductor substrate having an improved silicon-on-insulator structure fabricated by the above described fabrication steps will subsequently be described with reference to FIG. 3D.

The novel silicon-on-insulator substrate structure has the base silicon substrate 6. The polycrystalline silicon film 5 is formed on the base silicon substrate 6 but only in a predetermined region. The polycrystalline silicon film 4 is formed on the base silicon substrate 6 but in opposite region to the predetermined region. The dioxide silicon film 2 serving as an insulator film is formed on the polycrystalline silicon film 4. The mono-crystalline silicon layer 7 overlays both the dioxide silicon film 2 serving as an insulator film and the mono-crystalline silicon film 5. The structure results in that the mono-crystalline silicon layer 7 is electrically connected to the base silicon substrate 6 through the mono-crystalline silicon film 5.

As a modification of the above structure of the first embodiment, the following silicon-on-insulator substrate structure is also applicable, although illustration of the structure is omitted. A modified silicon-on-insulator substrate structure does not include a polycrystalline silicon film.

The modified silicon-on-insulator substrate structure also has a base silicon substrate. A mono-crystalline silicon film is formed on the base silicon substrate but only in a predetermined region. An insulator film such as a dioxide silicon film is formed on the base silicon substrate but in opposite region to the predetermined region. The mono-crystalline silicon layer also overlays both the insulator film and the mono-crystalline silicon film. The structure results in that the mono-crystalline silicon layer is also electrically connected to the base silicon substrate through the mono-crystalline silicon film.

Figure 4:
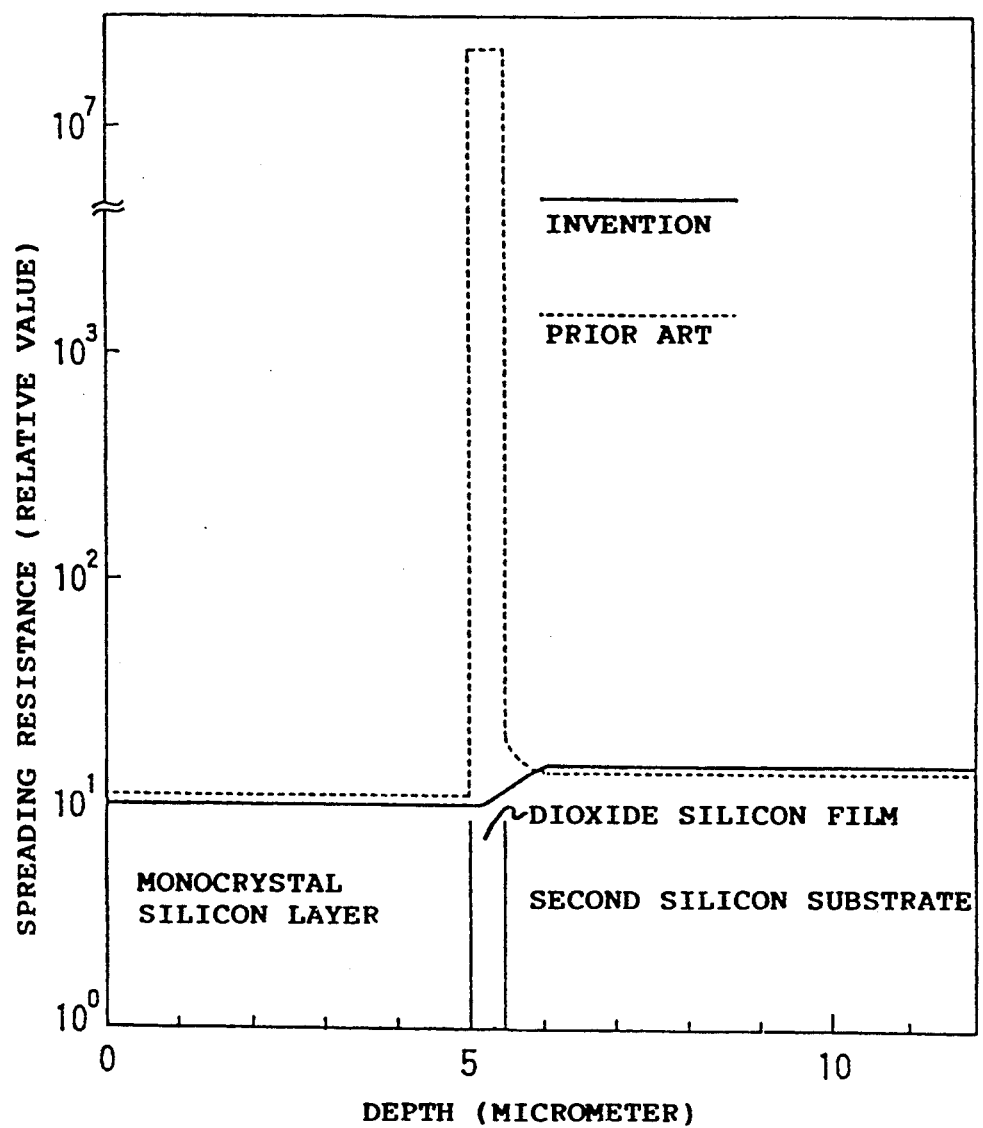
FIG. 4 is a diagram illustrative of a characteristic in a spreading resistance possessed by a semiconductor substrate having an improved silicon-on-insulator structure in a first embodiment according to the present invention, as compared to that of the prior art.

A spreading resistance of the silicon-on-insulator structure will be investigated. The respective spreading resistances of the novel and conventional silicon-on-insulator structures are illustrated in FIG. 4. The spreading resistance in a depth direction of each of the novel and conventional silicon-on-insulator structures is measured by a spreading resistance method. The second silicon substrate 6 serves as a base wafer. The mono-crystalline silicon layer 7 serves as an active region.

In the prior art, the conventional silicon-on-insulator structure has an undesirable profile of the spreading resistance. The profile of the spreading resistance possessed by the conventional silicon-on-insulator structure has an extremely high resistance portion such as a wall portion which serves as a potential barrier to carriers. The high spreading resistance portion serving as a potential barrier is represented at a depth where the dioxide silicon film 17 exists. Since the carriers experience a high potential barrier provided by a high spreading resistance portion when moving across the dioxide silicon film 17, the carriers are unable to move across the dioxide silicon film 17 between the base silicon substrate 18 and the mono-crystalline silicon layer 19. This teaches that the dioxide silicon film 17 serves as an insulator. From the above descriptions, it can be understood that the base silicon substrate 18 and the mono-crystalline silicon layer 19 are electrically separated from each other through the dioxide silicon film 18 serving as an insulator. Accordingly, the conventional silicon-on-insulator structure does not allow the base silicon substrate 18 to serve as an active region. The mono-crystalline silicon layer 19 only is available as an active region.

In contrast, the novel silicon-on-insulator structure of the first embodiment according to the present invention, thus, has a different profile of the spreading resistance in the depth direction as compared to the prior art. The difference in the spreading resistance profiles between the present invention and the prior art is most considerable at the mono-crystalline silicon film region or an intermediate region between the base silicon substrate 6 and the mono-crystalline silicon layer 7. The novel silicon-on-insulator structure has a desirable profile of the spreading resistance which includes a gentle sloped portion. The above gentle sloped portion of the spreading resistance profile appears at a depth where the mono-crystalline silicon film 5 exists. Namely, the profile of the spreading resistance has no high spreading resistance portion such as a hill portion or a wall portion serving as a potential barrier. This permits carriers to move without experience of a potential barrier between the base silicon substrate 6 and the mono-crystalline silicon layer 7 through the sandwiched mono-crystalline silicon film 5. Thus, the mono-crystalline silicon layer 7 and the base silicon substrate 6 are electrically conductive through the mono-crystalline silicon film 5. From the above description, it can be understood that the second silicon substrate 6 is electrically connected to the mono-crystalline silicon layer 7 through the mono-crystalline silicon film 5. This permits not only the mono-crystalline silicon layer 7 but also the base silicon substrate 6 to serve as active regions respectively.

Further, an effect of the gettering process for the heavy metal impurity in each of the novel and conventional silicon-on-insulator structure will subsequently be evaluated. To evaluate the effect of the gettering process for the heavy metal impurity, it is necessary to prepare a silicon-on-insulator structure substrate which has been polluted with a heavy metal. Thus, the silicon-on-insulator structure substrate is polluted from its surfaces with a heavy metal or iron up to a dose of $10^{12}$ atoms/cm$^2$. After that, the polluted silicon-on-insulator structure substrate but only a surface of the mono-crystalline silicon layer 7 is subjected to a diffusion of phosphorus as the n-type dopant or opposite conductive type dopant to that of the substrate. As a result, diffusion layers of phosphorus as the n-type dopant are formed in the surface region of the p-type mono-crystalline silicon layer 7. The diffusion layers have a high dopant concentration so that the diffusion layers are respectively serve as source and drain regions. After that, a gate insulation film, a gate electrode are respectively formed on the mono-crystalline silicon layer 7. In addition, source and drain electrodes are formed on the diffusion layers serving as the source and drain regions respectively. As a result, a metal oxide semiconductor field effect transistor (MOSFET) is formed on the mono-crystalline silicon layer 7. In this case, the mono-crystalline silicon layer 7 serves as a substrate of the MOS transistor.

Figure 5:
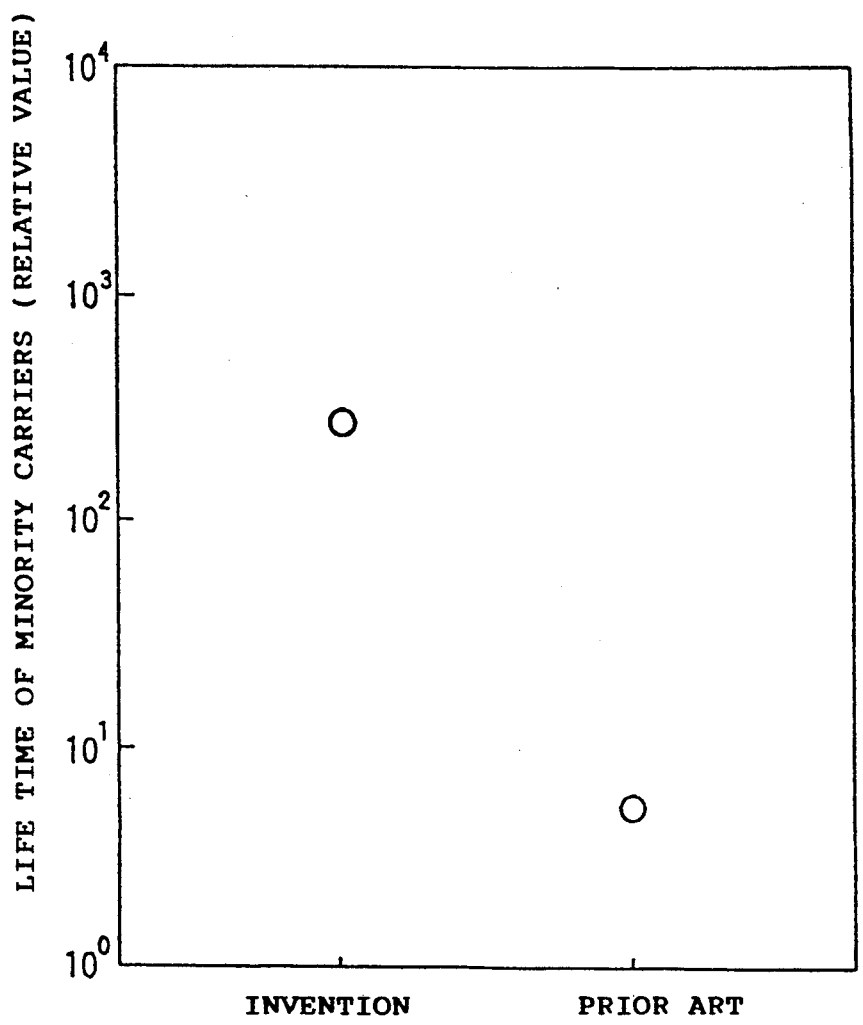
FIG. 5 is a diagram illustrative of a characteristic in a life time of minority carriers in a semiconductor substrate having an improved silicon-on-insulator structure of a first embodiment according to the present invention, as compared to that of the prior art.

The effect of the gettering treatment for the heavy metal or iron is evaluated by measuring a life-time of the mono-crystalline silicon layer 7. FIG. 5 illustrates the result of measuring the life-time of each of the mono-crystalline silicon layers 7 and 19 which are respectively formed in the first embodiment of the present invention and in the prior art. From FIG. 5, it can be understood that the mono-crystalline silicon layer 7 formed by the novel fabrication method of the first embodiment possesses an extremely long life-time as comprised to that of the mono-crystalline silicon layer 19 in the prior art. This teaches that the effect of the gettering treatment is considerable but only in the first embodiment of the present invention. The novel silicon-on-insulator structure permits the gettering treatment to exhibit a considerable effect, because the base silicon substrate 6 and the mono-crystalline silicon layer 7 are connected to each other through the mono-crystalline silicon film 5. Accordingly, the existence of the mono-crystalline silicon film 5 between the base silicon substrate 6 and the mono-crystalline silicon layer 7 permits the gettering treatment to exhibit a considerable effect. This permits the mono-crystalline silicon layer 7 serving as an active region to have an extremely long life-time as compared to that of the prior art.

A second embodiment of the present invention which provides a semiconductor device having an improved silicon-on-insulator structure will be described in detail with reference to FIGS. 6A to 6E.

Figure 6A:
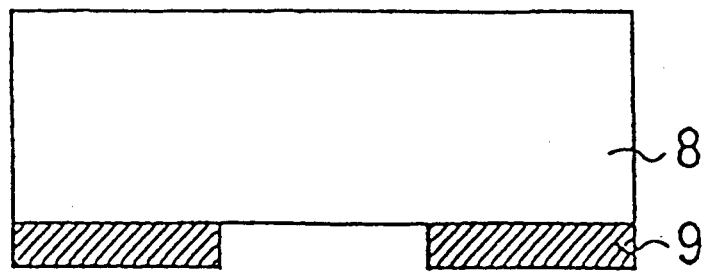
FIGS. 6A to 6E are fragmentary cross sectional elevation views illustrative of sequential steps involved in a novel fabrication method of a semiconductor substrate having an improved silicon-on-insulator structure of a second embodiment according to the present invention.

With reference to FIG. 6A, a first silicon substrate 8 which has been doped with an n-type dopant is prepared. The first silicon substrate 8 has a specific resistance of 15 ohm·cm. An entire surface of the first silicon substrate 8 is subjected to a thermal oxidation so that a dioxide silicon film 9 having a thickness of approximately 2000 angstroms is formed on the entire surface of the first silicon substrate 8. Further, the dioxide silicon film 9 but only in a predetermined region is removed by a dry etching process and a wet etching process. As a result, a surface of the first silicon substrate 8 but in the predetermined region is exposed. Then, the dioxide silicon film 9 remains only in an opposite region to the predetermined region. Then, a surface region but in the predetermined region of the first silicon substrate 8 is exposed. A surface region except for the predetermined region of the first silicon substrate 8 is covered with the remaining dioxide silicon film 9 which serves as an insulator film.

Figure 6B:
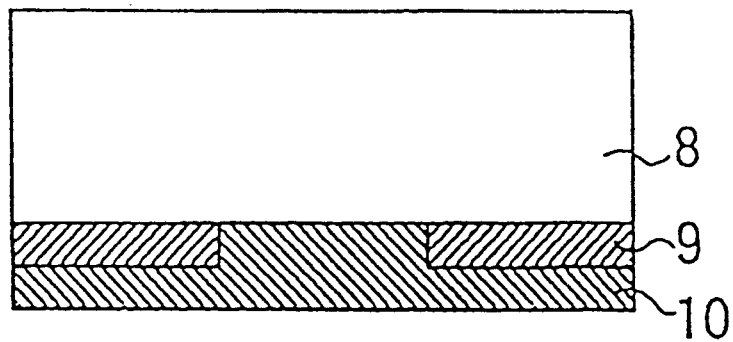

With reference to FIG. 6B, a chemical vapor deposition for amorphous silicon is accomplished. As a result, a polycrystalline silicon film 10 having a thickness of approximately 1 micrometers is formed on an entire surface of the device so as to cover both the remaining dioxide silicon film 9 and the exposed surface of the first silicon substrate 8. Further, a surface of the polycrystalline silicon film 10 is subjected to a mirror polishing so as to have no stress and an excellent flatness.

Figure 6C:
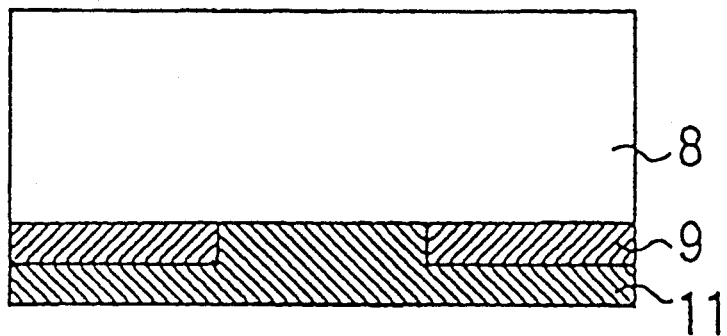

With reference to FIG. 6C, an ion-implantation of silicon to the mirror polished polycrystalline silicon film 10 is accomplished at an energy of 300 kV and a dose of $1 \times 10^{16}$ atoms/cm$^2$ thereby the mirror polished polycrystalline silicon film 10 becomes an amorphous silicon film 11.

Figure 6D:
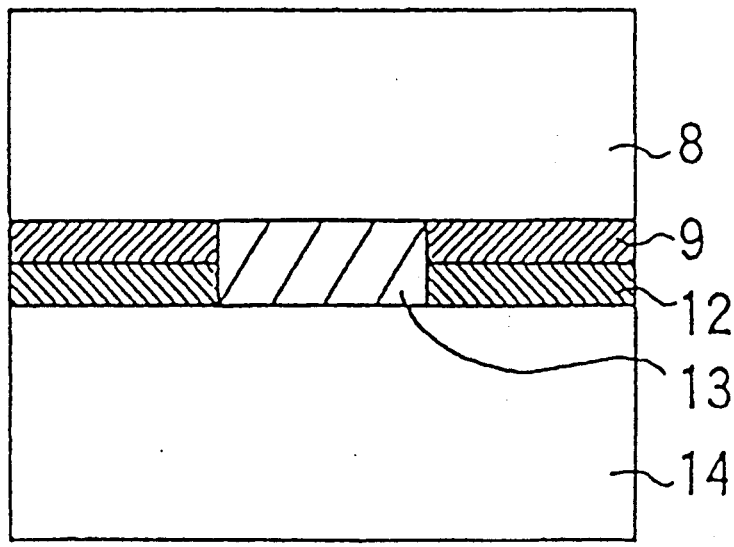

With reference to FIG. 6D, a second silicon substrate 14 which has been doped with the n-type dopant is prepared. The second silicon substrate 14 has a specific resistance of 20 ohm·cm. The second silicon substrate 14 is contacted with the first silicon substrate 8 through the mirror polished amorphous silicon film 11. After that, the first and second silicon substrates 8 and 14 contacted through the mirror polished amorphous silicon film 11 is subjected to a heat treatment at a temperature of 1000° C. in a nitrogen atmosphere for an hour. As a result, the first and second silicon substrates 8 and 14 are bonded through the mirror polished amorphous silicon film 11. Concurrently, the mirror polished amorphous silicon film 11 but only at its part in contact with the dioxide silicon film 9 is made into a polycrystalline silicon film 12. In contrast, the mirror polished amorphous silicon film 11 but at its opposite part in contact with the exposed surface of the first silicon substrate 8 is made into a mono-crystalline silicon film 13.

Figure 6E:
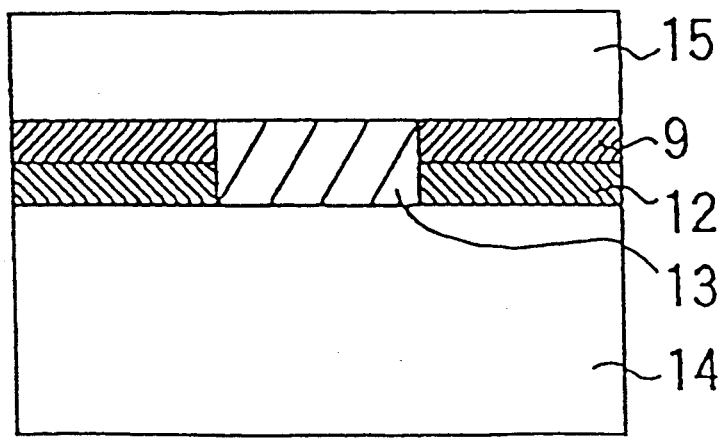

With reference to FIG. 6E, an opposite surface of the first silicon substrate 8 to the dioxide silicon film 9 is subjected to a mirror polishing thereby the dioxide silicon film is made into a mono-crystalline silicon layer 15 having a thickness of approximately 3 micrometers.

The structure of a novel semiconductor substrate having an improved silicon-on-insulator structure fabricated by the above described fabrication steps will subsequently be described with reference to FIG. 6E.

The novel silicon-on-insulator substrate structure has the base silicon substrate 14. The polycrystalline silicon film 13 is formed on the base silicon substrate 14 but only in a predetermined region. The polycrystalline silicon film 12 is formed on the base silicon substrate 14 but in opposite region to the predetermined region. The dioxide silicon film 9 serving as an insulator film is formed on the polycrystalline silicon film 12. The mono-crystalline silicon layer 15 overlays both the dioxide silicon film 9 serving as an insulator film and the mono-crystalline silicon film 13. The structure results in that the mono-crystalline silicon layer 15 is electrically connected to the base silicon substrate 14 through the mono-crystalline silicon film 13.

As a modification of the above structure of the second embodiment, the following silicon-on-insulator substrate structure is also applicable, although illustration of the structure is omitted. A modified silicon-on-insulator substrate structure does not include a polycrystalline silicon film.

The modified silicon-on-insulator substrate structure also has a base silicon substrate. A mono-crystalline silicon film is formed on the base silicon substrate but only in a predetermined region. An insulator film such as a dioxide silicon film is formed on the base silicon substrate but in opposite region to the predetermined region. The mono-crystalline silicon layer also overlays both the insulator film and the mono-crystalline silicon film. The structure results in that the mono-crystalline silicon layer is also electrically connected to the base silicon substrate through the mono-crystalline silicon film.

Figure 7:
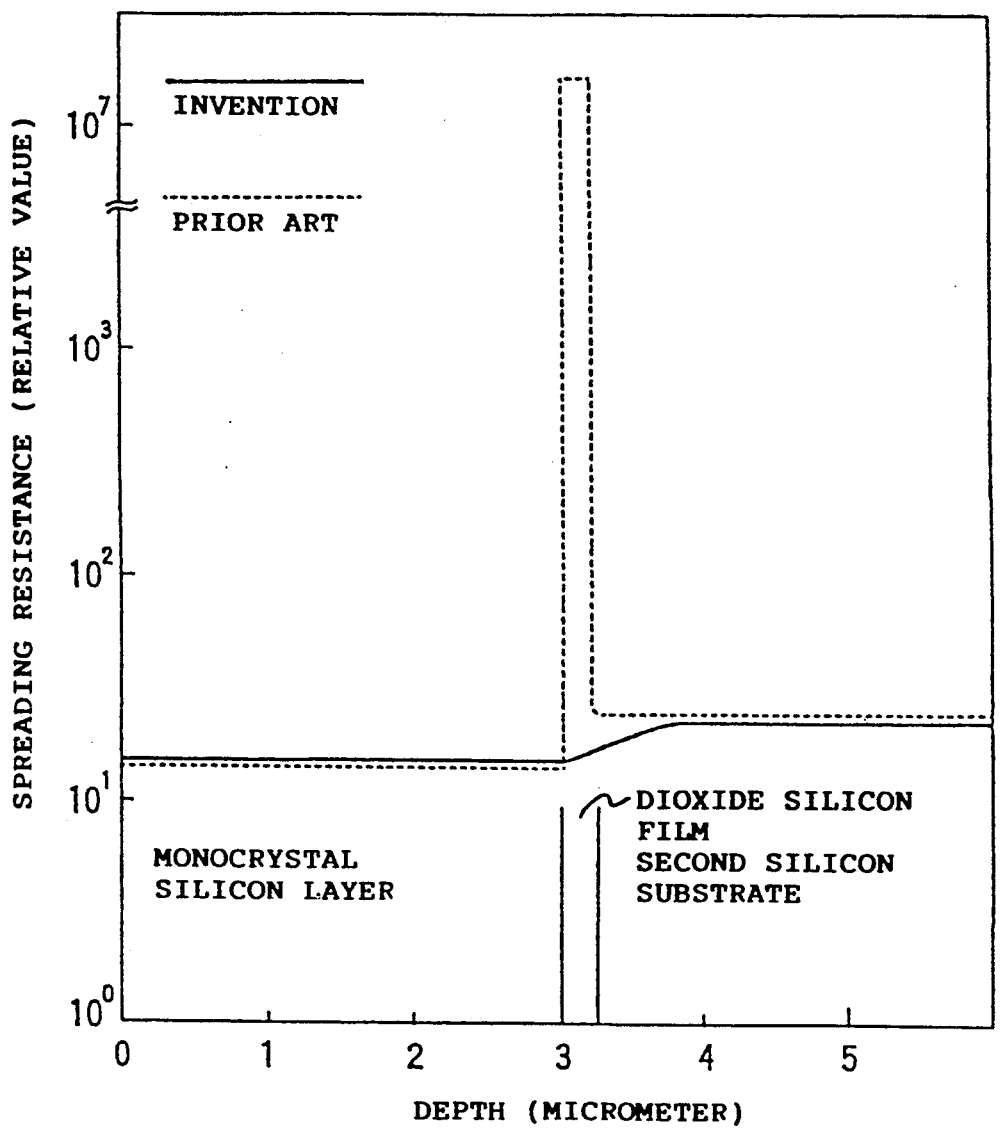
FIG. 7 is a diagram illustrative of a characteristic in a spreading resistance possessed by a semiconductor substrate having an improved silicon-on-insulator structure in a second embodiment according to the present invention, as compared to that of the prior art.

A spreading resistance of the silicon-on-insulator structure will be investigated. The respective spreading resistances of the novel and conventional silicon-on-insulator structures are illustrated in FIG. 7. The spreading resistance in a depth direction of each of the novel and conventional silicon-on-insulator structures is measured by a spreading resistance method. The second silicon layer 14 serves as a base wafer. The mono-crystalline silicon layer 15 serves as an active region.

In the prior art, the conventional silicon-on-insulator structure has an undesirable profile of the spreading resistance. The profile of the spreading resistance possessed by the conventional silicon-on-insulator structure has an extremely high resistance portion such as a wall portion which serves as a potential barrier to carriers. The high spreading resistance portion serving as a potential barrier is represented at a depth where the dioxide silicon film 17 exists. Since the carriers experience a high potential barrier provided by a high spreading resistance portion when moving across the dioxide silicon film 17, the carriers are unable to move across the dioxide silicon film 17 between the base silicon substrate 18 and the mono-crystalline silicon layer 19. This teaches that the dioxide silicon film 17 serves as an insulator. From the above descriptions, it can be understood that the base silicon substrate 18 and the mono-crystalline silicon layer 19 are electrically separated from each other through the dioxide silicon film 18 serving as an insulator. Accordingly, the conventional silicon-on-insulator structure does not allow the base silicon substrate 18 to serve as an active region. The mono-crystalline silicon layer 19 only is available as an active region.

In contrast, the novel silicon-on-insulator structure of the second embodiment according to the present invention, thus, has a different profile of the spreading resistance in the depth direction as compared to the prior art. The difference in the spreading resistance profiles between the present invention and the prior art is most considerable at the mono-crystalline silicon film region and the dioxide silicon film region between the base silicon substrate 14 and the mono-crystalline silicon layer 15. The novel silicon-on-insulator structure has a desirable profile of the spreading resistance which includes a gentle sloped portion. The gradient of the sloped portion involved in the spreading resistance profile is further gentler than that of the first embodiment described above. The gentle sloped portion of the spreading resistance profile occurs at a depth where the mono-crystalline silicon film 13 exists. Namely, the profile of the spreading resistance has no high spreading resistance portion such as a hill portion or a wall portion which is able to serve as a potential barrier. This enables carriers to move without experience of a potential barrier between the base silicon substrate 14 and the mono-crystalline silicon layer 15 through the mono-crystalline silicon film 13. Thus, the mono-crystalline silicon layer 15 and the base silicon substrate 14 are electrically conductive through the mono-crystalline silicon film 13. From the above description, it can be understood that the second silicon substrate 14 is electrically connected to the mono-crystalline silicon layer 15 through the mono-crystalline silicon film 13. This allows not only the mono-crystalline silicon layer 15 but also the base silicon substrate 14 to serve as active regions respectively.

Further, an effect of the gettering process for the heavy metal impurity in each of the novel and conventional silicon-on-insulator structure will subsequently be evaluated. To evaluate the effect of the gettering process for the heavy metal impurity, it is necessary to prepare a silicon-on-insulator structure substrate which has been polluted with a heavy metal. Thus, the silicon-on-insulator structure substrate is polluted from its surfaces with a heavy metal or iron up to a dose of $10^{12}$ atoms/cm$^2$. After that, the polluted silicon-on-insulator structure substrate but only at a surface of the mono-crystalline silicon layer 15 is subjected to a diffusion of a p-type dopant or opposite conductive type dopant to that of the substrate. As a result, p-type diffusion layers are formed in the surface region of the n-type mono-crystalline silicon layer 15. The diffusion layers have a high dopant concnetration so that the diffusion layers are respectively serve as source and drain regions. After that, a gate insulation film, a gate electrode are respectively formed on the mono-crystalline silicon layer 15. In addition, source and drain electrodes are formed on the diffusion layers serving as the source and drain regions respectively. As a result, a metal oxide semiconductor field effect transistor (MOSFET) is formed on the mono-crystalline silicon layer 15. In this case, the mono-crystalline silicon layer 15 serves as a substrate of the MOS transistor.

Figure 8:
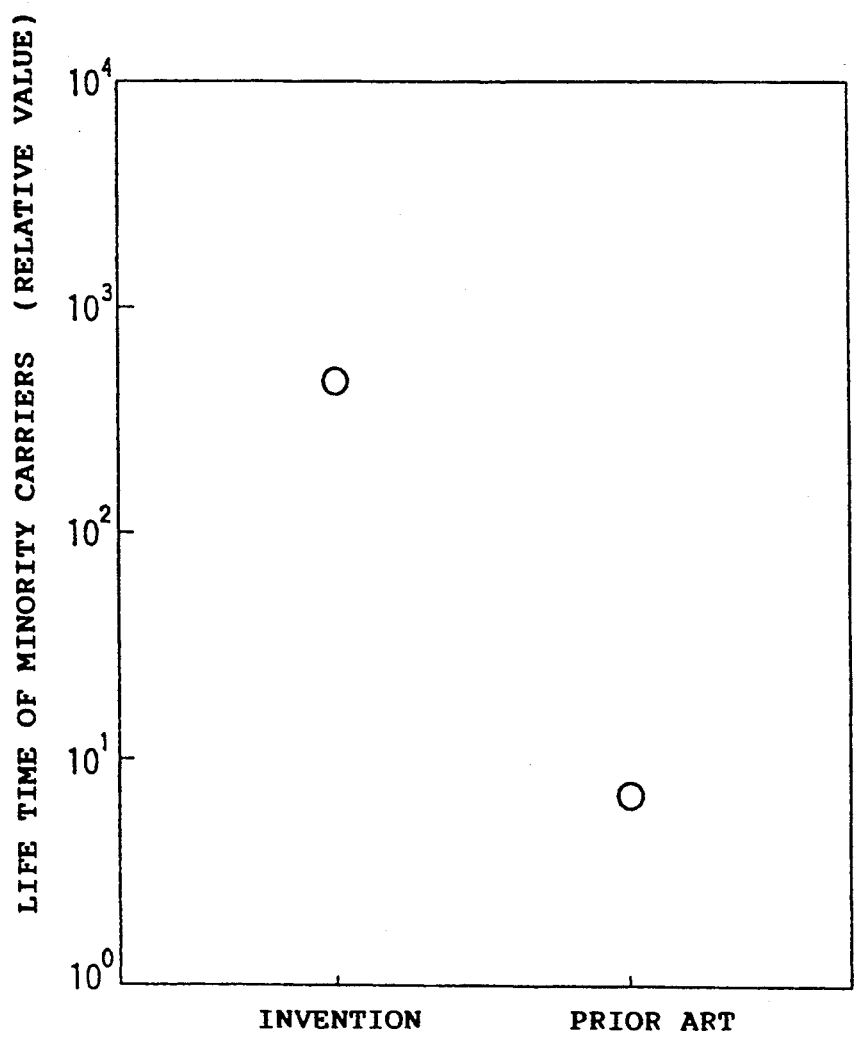
FIG. 8 is a diagram illustrative of a characteristic in a life time of minority carriers in a semiconductor substrate having an improved silicon-on-insulator structure of a second embodiment according to the present invention, as compared to that of the prior art.

The effect of the gettering treatment for the heavy metal or iron is evaluated by measuring a life-time of the mono-crystalline silicon layer 15. FIG. 8 illustrates the result of measuring the life-time of each of the mono-crystalline silicon layers 15 and 19 which are respectively formed in the second embodiment of the present invention and in the prior art. From FIG. 8, it can be understood that the mono-crystalline silicon layer 15 formed by the novel fabrication method of the second embodiment possesses an extremely long life-time as comprised to that of the mono-crystalline silicon layer 19 in the prior art. This teaches that the effect of the gettering treatment is considerable but only in the second embodiment of the present invention. The novel silicon-on-insulator structure permits the gettering treatment to exhibit a considerable effect, because the base silicon substrate 14 and the mono-crystalline silicon layer 15 are connected to each other through the mono-crystalline silicon film 13. Accordingly, the existence of the mono-crystalline silicon film 13 between the base silicon substrate 14 and the mono-crystalline silicon layer 15 permits the gettering treatment to exhibit a considerable effect. This permits the mono-crystalline silicon layer 15 serving as an active region to have an extremely long life-time as compared to that of the prior art.

Whereas modifications of the present invention will no doubt be apparent to a person having ordinary skill in the art to which the invention pertains, it is to be understood that the embodiments shown and described by way of illustrations are by no means intended to be considered in a limiting sense. Accordingly, it is to be intended to cover by claims all modifications which fall within the sprit and scope of the invention.

What is claimed is:

1. A method of fabricating a semiconductor substrate having a silicon-on-insulator structure comprising the steps of:

forming selectively an insulation film on one surface of a first silicon substrate so as to expose said one surface in a predetermined region of said first silicon substrate;

forming an amorphous silicon film so as to cover both said insulation film and said exposed surface of said first silicon substrate;

contacting said first silicon substrate with a second silicon substrate through said amorphous silicon film;

subjecting said first and second silicon substrates to a heat treatment so that said amorphous silicon film becomes both a mono-crystalline silicon film in contact with said exposed surface of said first silicon substrate and a polycrystalline silicon film in contact with said insulator film, thereby electrically connecting between said first and second silicon substrates through said mono-crystalline silicon film; and subjecting said first silicon substrate to a polishing treatment at opposite surface so as to have a predetermined thickness.

2. The fabrication method as claimed in claim 1, wherein said insulator film is a dioxide silicon film.

3. The fabrication method as claimed in claim 2, wherein said dioxide silicon film is formed by a thermal oxidation, a dry etching and a wet etching.

4. The fabrication method as claimed in claim 1, wherein said second step of forming said amorphous silicon film comprises the step of accomplishing a chemical vapor deposition of amorphous silicon.

5. The fabrication method as claimed in claim 1, wherein said second step of forming said amorphous silicon film comprises the steps of:

forming a polycrystalline silicon film on the device so as to cover both said insulation film and said exposed surface of said first silicon substrate; and accomplishing an ion-implantation of silicon to said polycrystalline silicon film so that said polycrystalline silicon becomes an amorphous silicon.

6. The fabrication process as claimed in claim 5, wherein said ion-implantation of silicon is accomplished at an energy of 300 kV and at a dose of $1 \times 10^{16}$ atoms/cm$^2$.

7. The fabrication method as claimed in claim 5, wherein said polycrystalline silicon film is formed by a chemical vapor deposition.

8. The fabrication method as claimed in claim 1, further comprising the step of subjecting a surface of said amorphous silicon film to a mirror polishing treatment prior to said third contacting step.

9. The fabrication method as claimed in claim 1, wherein said heat treatment is accomplished at a temperature of 1100° C. for an hour in a nitrogen atmosphere.

10. The fabrication method as claimed in claim 1, wherein said polishing treatment to said second silicon substrate is a mirror polishing treatment.

11. The fabrication method as claimed in claim 1, wherein said first and second silicon substrate are doped with a p-type dopant.

12. The fabrication method as claimed in claim 1, wherein said first and second silicon substrate are doped with an n-type dopant.

* * * * *